(12) United States Patent
Hsu et al.

(10) Patent No.: US 11,282,844 B2
(45) Date of Patent: Mar. 22, 2022

(54) ERASABLE PROGRAMMABLE NON-VOLATILE MEMORY INCLUDING TWO FLOATING GATE TRANSISTORS WITH THE SAME FLOATING GATE

(71) Applicant: eMemory Technology Inc., Hsin-Chu (TW)

(72) Inventors: Chia-Jung Hsu, Hsinchu County (TW); Wein-Town Sun, Hsinchu County (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 29 days.

(21) Appl. No.: 16/281,165

(22) Filed: Feb. 21, 2019

(65) Prior Publication Data

US 2020/0006363 A1 Jan. 2, 2020

Related U.S. Application Data

(60) Provisional application No. 62/690,894, filed on Jun. 27, 2018.

(51) Int. Cl.
*H01L 27/11519* (2017.01)
*H01L 27/11517* (2017.01)
(Continued)

(52) U.S. Cl.
CPC .... *H01L 27/11519* (2013.01); *G11C 16/0416* (2013.01); *G11C 16/0433* (2013.01);
(Continued)

(58) Field of Classification Search
CPC ......... H01L 27/11517; H01L 27/11519; H01L 27/11524; H01L 28/40; H01L 29/1095;
(Continued)

(56) References Cited

U.S. PATENT DOCUMENTS 5,225,700 A * 7/1993 Smayling ............ H01L 29/7883
257/321
5,355,007 A * 10/1994 Smayling .............. H01L 27/105
257/319
(Continued)

OTHER PUBLICATIONS

Taiwan Intellectual Property Office, Office Action dated Oct. 30, 2019.

*Primary Examiner* — Scott B Geyer
(74) *Attorney, Agent, or Firm* — WPAT, PC

(57) ABSTRACT

An erasable programmable non-volatile memory includes a first select transistor, a first floating gate transistor, a second select transistor and a second floating gate transistor. A select gate and a first source/drain terminal of the first select transistor receive a first select gate voltage and a first source line voltage, respectively. A first source/drain terminal and a second source/drain terminal of the first floating gate transistor are connected with a second source/drain terminal of the first select transistor and a first bit line voltage, respectively. A select gate and a first source/drain terminal of the second select transistor receive a second select gate voltage and a second source line voltage, respectively. A first source/drain terminal and a second source/drain terminal of the second floating gate transistor are connected with the second source/drain terminal of the second select transistor and a second bit line voltage, respectively.

17 Claims, 8 Drawing Sheets

(51) Int. Cl.
   *G11C 16/04*     (2006.01)
   *G11C 16/12*     (2006.01)
   *G11C 16/10*     (2006.01)
   *G11C 16/14*     (2006.01)
   *G11C 16/26*     (2006.01)
   *H01L 27/11524*  (2017.01)
   *H01L 49/02*     (2006.01)
   *H01L 29/10*     (2006.01)
   *H01L 29/423*    (2006.01)
   *H01L 29/788*    (2006.01)
   *H01L 27/1156*   (2017.01)
   *H01L 29/49*     (2006.01)

(52) U.S. Cl.
   CPC .............. *G11C 16/10* (2013.01); *G11C 16/12* (2013.01); *G11C 16/14* (2013.01); *G11C 16/26* (2013.01); *H01L 27/1156* (2013.01); *H01L 27/11517* (2013.01); *H01L 27/11524* (2013.01); *H01L 28/40* (2013.01); *H01L 29/1095* (2013.01); *H01L 29/42324* (2013.01); *H01L 29/42328* (2013.01); *H01L 29/788* (2013.01); *H01L 29/7885* (2013.01); *G11C 2216/04* (2013.01); *H01L 29/4916* (2013.01)

(58) Field of Classification Search
   CPC ......... H01L 29/42324; H01L 29/42328; H01L 29/4916; H01L 29/788; H01L 29/7884; H01L 29/7885; H01L 27/11551–11556; H01L 27/11521–11524; H01L 27/1156; G11C 16/0416; G11C 16/0425; G11C 16/0433; G11C 16/045; G11C 16/10; G11C 16/12; G11C 16/14; G11C 16/26; G11C 2216/04
   See application file for complete search history.

(56) References Cited

U.S. PATENT DOCUMENTS

| | | | |
|---|---|---|---|
| 7,209,392 B2 * | 4/2007 | Chen | G11C 16/0441 257/E27.103 |
| 8,634,254 B2 | 1/2014 | Hsu et al. | |
| 8,941,167 B2 | 1/2015 | Chen et al. | |
| 2006/0018161 A1 | 1/2006 | Chen et al. | |
| 2010/0329016 A1 * | 12/2010 | Taniguchi | H01L 27/11558 365/185.18 |
| 2012/0056257 A1 * | 3/2012 | Choi | H01L 27/11558 257/300 |

* cited by examiner

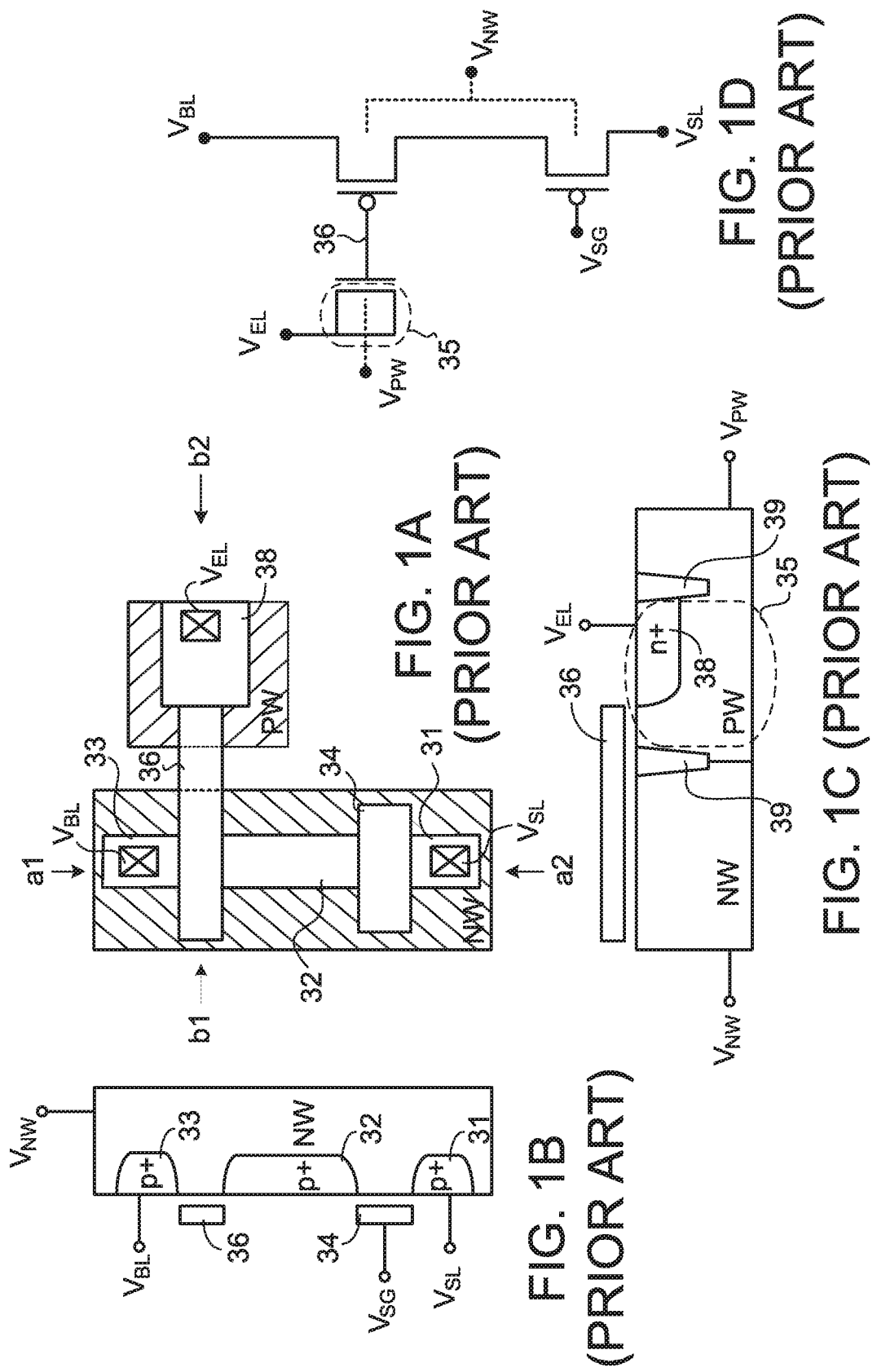

|        | PGM   | ERS    | Read  |
|--------|-------|--------|-------|
| $V_{SG1}$ | 0V    | 7.5V   | 2.5V  |
| $V_{SL1}$ | 5V    | 7.5V   | 2.5V  |
| $V_{BL1}$ | -2V   | 7.5V   | 2.5V  |
| $V_{NW}$  | 5V    | 7.5V   | 2.5V  |
| $V_{SG2}$ | 0→5V  | -7.5V  | 2.5V  |
| $V_{SL2}$ | 0→5V  | -7.5V  | 0V    |
| $V_{BL2}$ | 0→5V  | -7.5V  | 2.5V  |
| $V_{PW}$  | 0     | -7.5V  | 0V    |
FIG. 3A
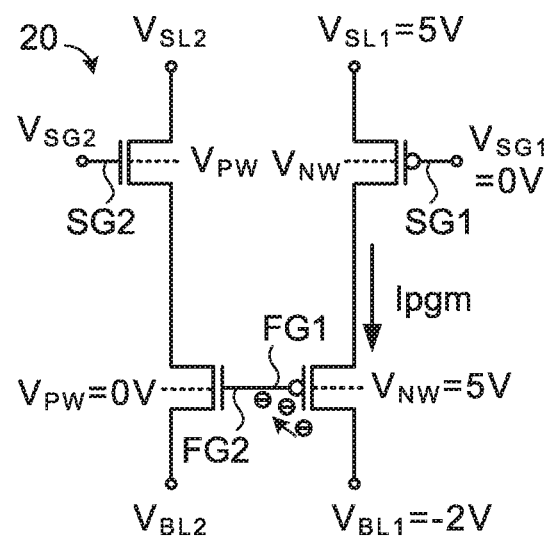
FIG. 3B
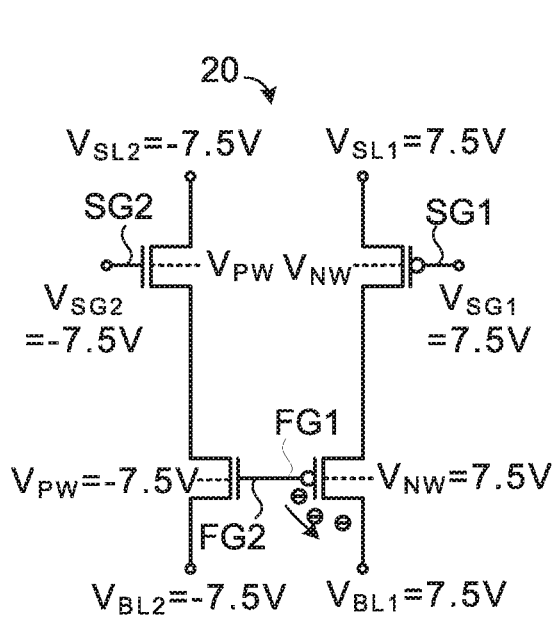
FIG. 3C
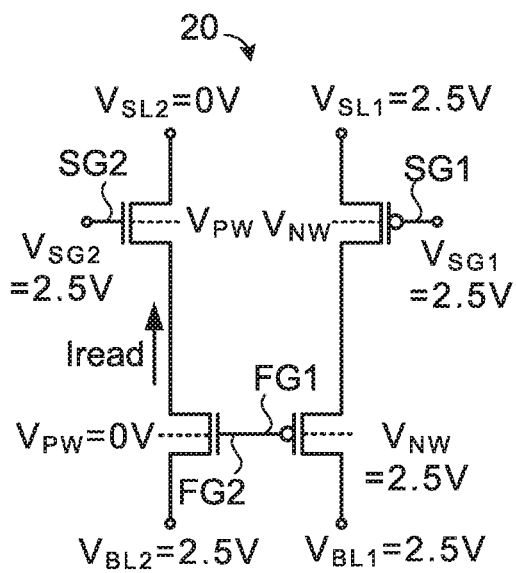
FIG. 3D

|  | PGM | ERS | Read |
|---|---|---|---|
| $V_{SG1}$ | 3.5V | 7.5V | 2.5V |
| $V_{SL1}$ | 7V | 15V | 2.5V |
| $V_{BL1}$ | 0V | 15V | 2.5V |
| $V_{NW}$ | 7V | 15V | 2.5V |
| $V_{SG2}$ | 3→6V | 0V | 2.5V |
| $V_{SL2}$ | 3→6V | 0V | 0V |
| $V_{BL2}$ | 3→6V | 0V | 2.5V |
| $V_{PW}$ | 0V | 0V | 0V |

|  | PGM | ERS | Read |
|---|---|---|---|
| $V_{SG}$ | 0V | 7.5V | 2.5V |
| $V_{SL1}$ | 5V | 7.5V | 2.5V |
| $V_{BL1}$ | -2V | 7.5V | 2.5V |
| $V_{NW}$ | 5V | 7.5V | 2.5V |
| $V_{SL2}$ | 0→5V | -7.5V | 0V |
| $V_{BL2}$ | 0→5V | -7.5V | 2.5V |
| $V_{PW}$ | 0 | -7.5V | 0V |
FIG. 7A
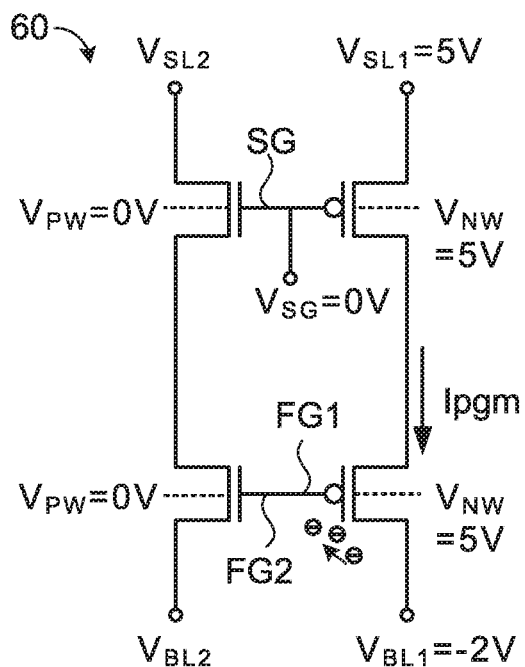
FIG. 7B
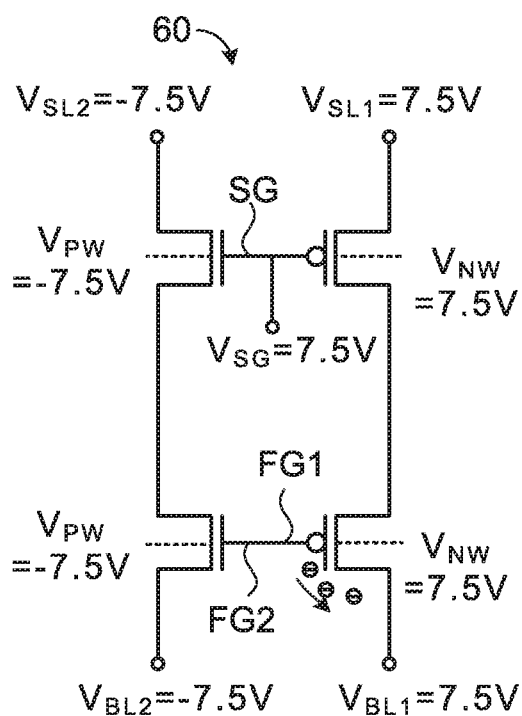
FIG. 7C
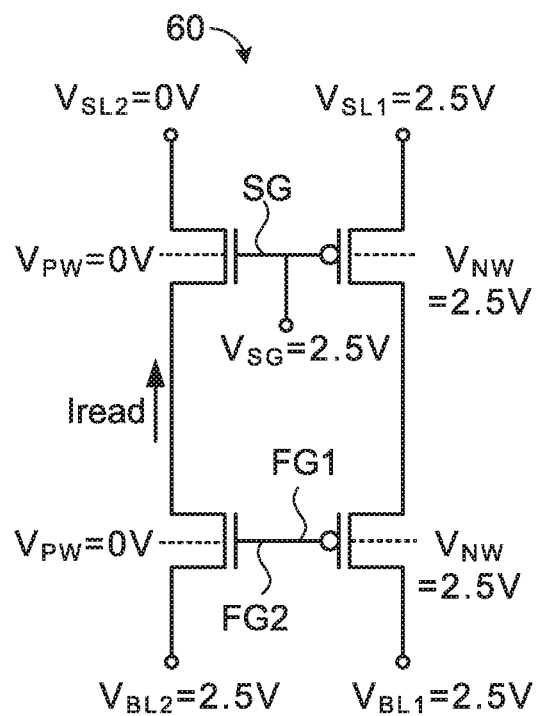
FIG. 7D

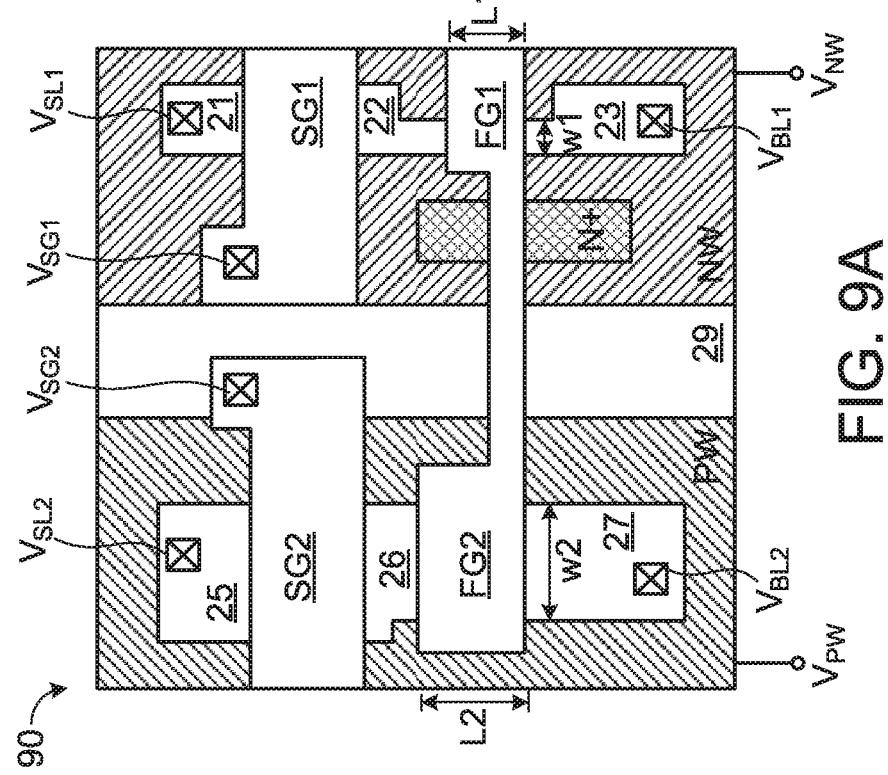
FIG. 9A
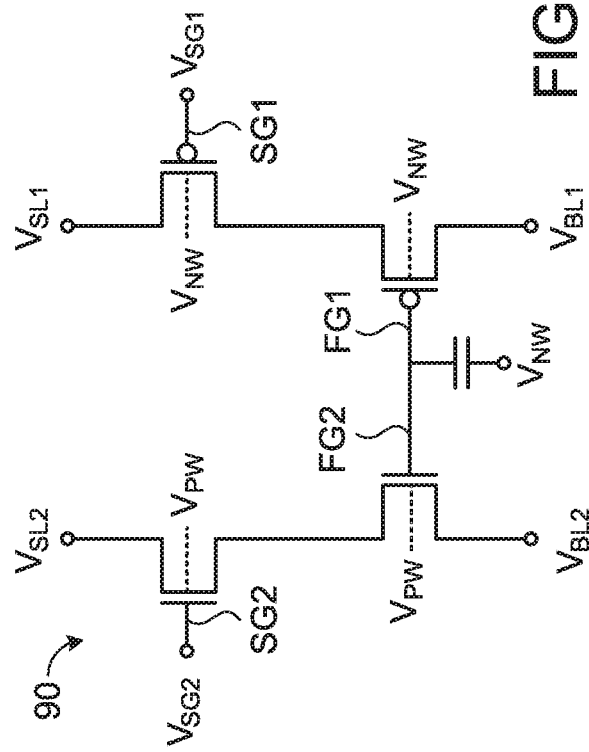
FIG. 8
FIG. 9B
| | PGM | ERS | Read |
|---|---|---|---|
| $V_{SG}$ | 3.5V | 7.5V | 2.5V |
| $V_{SL1}$ | 7V | 15V | 2.5V |
| $V_{BL1}$ | 0V | 15V | 2.5V |
| $V_{NW}$ | 7V | 15V | 2.5V |
| $V_{SL2}$ | 3→6V | 0V | 0V |
| $V_{BL2}$ | 3→6V | 0V | 2.5V |
| $V_{PW}$ | 0 | 0V | 0V |

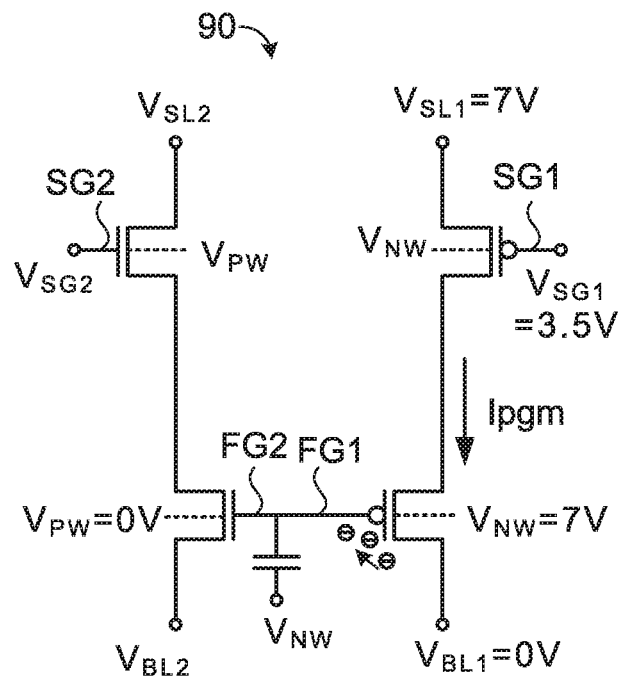
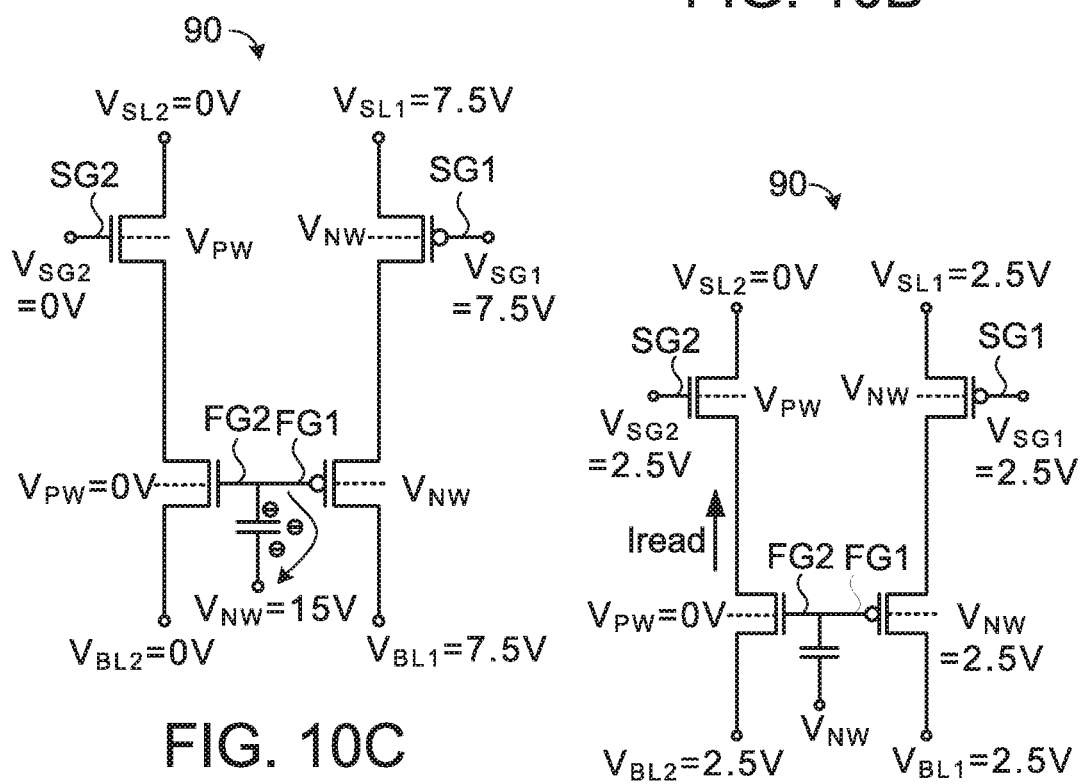
FIG. 10A
FIG. 10B
FIG. 10C
FIG. 10D

ERASABLE PROGRAMMABLE NON-VOLATILE MEMORY INCLUDING TWO FLOATING GATE TRANSISTORS WITH THE SAME FLOATING GATE

This application claims the benefit of U.S. provisional application Ser. No. 62/690,894, filed Jun. 27, 2018, the subject matter of which is incorporated herein by reference.

FIELD OF THE INVENTION

The present invention relates to a non-volatile memory, and more particularly to an erasable programmable non-volatile memory.

BACKGROUND OF THE INVENTION

FIGS. 1A~1D schematically illustrate the structure and the equivalent circuit of a conventional erasable programmable non-volatile memory. For example, the conventional erasable programmable non-volatile memory is disclosed in U.S. Pat. No. 8,941,167. FIG. 1A is a schematic top view of a conventional non-volatile memory. FIG. 1B is a schematic cross-sectional view illustrating the conventional non-volatile memory of FIG. 1A and taken along a first direction (a1-a2). FIG. 1C is a schematic cross-sectional view illustrating the non-volatile memory of FIG. 1A and taken along a second direction (b1-b2). FIG. 1D is a schematic equivalent circuit diagram of the conventional non-volatile memory.

As shown in FIGS. 1A and 1B, the conventional non-volatile memory comprises two serially-connected p-type transistors. These two p-type transistors are constructed in an n-well region (NW). Three p-type doped regions 31, 32 and 33 are formed in the n-well region (NW). In addition, two polysilicon gates 34 and 36 are spanned over the areas between the three p-type doped regions 31, 32 and 33.

The first p-type transistor is used as a select transistor, and the polysilicon gate 34 (also referred as a select gate) of the first p-type transistor is connected to a select gate voltage $V_{SG}$. The p-type doped region 31 is connected to a source line voltage $V_{SL}$. The p-type doped region 32 is a combination of a p-type doped drain region of the first p-type transistor and a p-type doped region of the second p-type transistor. The second p-type transistor is a floating gate transistor. The polysilicon gate 36 (also referred as a floating gate) is disposed over the second p-type transistor. The p-type doped region 33 is connected to a bit line voltage $V_{BL}$. Moreover, the n-well region (NW) is connected to an n-well voltage $V_{NW}$.

As shown in FIGS. 1A and 10, the conventional non-volatile memory further comprises an n-type transistor. The n-type transistor is composed of the floating gate 36 and an erase gate region 35. The n-type transistor is constructed in a p-well region (PW). An n-type doped region 38 is formed in the p-well region (PW). That is, the erase gate region 35 contains the p-well region (PW) and the n-type doped region 38.

As shown in FIG. 1A, the floating gate 36 is extended externally and located near the erase gate region 35. Consequently, the floating gate 36 is also the gate terminal of the n-type transistor. Moreover, the n-type doped region 38 may be considered as a combination of an n-type doped source region and an n-type doped drain region. The n-type doped region 38 is connected to an erase line voltage $V_{EL}$. In addition, the p-well region (PW) is connected to a p-well voltage $V_{PW}$. As shown in FIG. 10, the erase gate region 35 and the n-well region (NW) are isolated from each other by a shallow trench isolation (STI) structure 39.

As shown in the equivalent circuit of FIG. 1D, the non-volatile memory comprises a select transistor, a floating gate transistor and an n-type transistor. The select transistor and the floating gate transistor are p-type transistors and constructed in the n-well region (NW). The n-well region (NW) receives the n-well voltage $V_{NW}$. The n-type transistor is constructed in the p-well region (PW). In addition, the p-well region (PW) receives the p-well voltage $V_{PW}$.

The select gate of the select transistor receives the select gate voltage $V_{SG}$. The first source/drain terminal of the select transistor receives the source line voltage $V_{SL}$. The first source/drain terminal of the floating gate transistor is connected with the second source/drain terminal of the select transistor. The second source/drain terminal of the floating gate transistor receives the bit line voltage $V_{BL}$. The gate terminal of the n-type transistor and the floating gate of the floating gate transistor are connected with each other. The first source/drain terminal of the n-type transistor and the second source/drain terminal of the n-type transistor are connected with each other to receive the erase line voltage $V_{EL}$.

SUMMARY OF THE INVENTION

The present invention provides an erasable programmable non-volatile memory with a novel structure.

An embodiment of the present invention provides an erasable programmable non-volatile memory. The erasable programmable non-volatile memory includes a first select transistor, a first floating gate transistor, a second select transistor and a second floating gate transistor. The first select transistor includes a select gate, a first source/drain terminal and a second source/drain terminal. The select gate of the first select transistor receives a first select gate voltage. The first source/drain terminal of the first select transistor receives a first source line voltage. The first floating gate transistor includes a floating gate, a first source/drain terminal and a second source/drain terminal. The first source/drain terminal of the first floating gate transistor is connected with the second source/drain terminal of the first select transistor. The second source/drain terminal of the first floating gate transistor receives a first bit line voltage. The second select transistor includes a select gate, a first source/drain terminal and a second source/drain terminal. The select gate of the second select transistor receives a second select gate voltage. The first source/drain terminal of the second select transistor receives a second source line voltage. The second floating gate transistor includes a floating gate, a first source/drain terminal and a second source/drain terminal. The first source/drain terminal of the second floating gate transistor is connected with the second source/drain terminal of the second select transistor. The second source/drain terminal of the second floating gate transistor receives a second bit line voltage. The first select transistor and the first floating gate transistor are constructed in a first-type well region. The second select transistor and the second floating gate transistor are constructed in a second-type well region. The floating gate of the first floating gate transistor and the floating gate of the second floating gate transistor are connected with each other.

Another embodiment of the present invention provides an erasable programmable non-volatile memory. The erasable programmable non-volatile memory includes a first-type well region, a first doped region, a second doped region, a third doped region, a first select gate, a first floating gate, a second-type well region, a fourth doped region, a fifth doped region, a sixth doped region, a second select gate and a second floating gate. The first doped region, the second doped region and the third doped region are formed in a surface of the first-type well region. The first doped region receives a first source line voltage. The third doped region receives a first bit line voltage. The first select gate is spanned over an area between the first doped region and the second doped region. The first select gate receives a first select gate voltage. The first floating gate is spanned over an area between the second doped region and the third doped region. The fourth doped region, the fifth doped region and the sixth doped region are formed in a surface of the second-type well region. The fourth doped region receives a second source line voltage. The sixth doped region receives a second bit line voltage. The second select gate is spanned over an area between the fourth doped region and the fifth doped region. The second select gate receives a second select gate voltage. The second floating gate is spanned over an area between the fifth doped region and the sixth doped region. The second floating gate is contacted with the first floating gate.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIGS. 1A~1D (prior art) schematically illustrate the structure and the equivalent circuit of a conventional erasable programmable non-volatile memory;

FIGS. 3A~3D schematically illustrate the bias voltages and the operations of the erasable programmable non-volatile memory according to the first embodiment of the present invention in a negative operation mode;

FIGS. 7A~7D schematically illustrate the bias voltages and the operations of the erasable programmable non-volatile memory according to the third embodiment of the present invention in a negative operation mode;

FIG. 8 schematically illustrates the bias voltages of the erasable programmable non-volatile memory according to the third embodiment of the present invention in a positive operation mode;

FIG. 9A is a schematic top view illustrating an erasable programmable non-volatile memory according to a fourth embodiment of the present invention;

FIG. 9B is a schematic equivalent circuit diagram of the erasable programmable non-volatile memory of FIG. 9A; and FIGS. 10A~10D schematically illustrate the bias voltages and the operations of the erasable programmable non-volatile memory according to the fourth embodiment of the present invention in a positive operation mode.

DETAILED DESCRIPTION OF PREFERRED EMBODIMENTS

Figure 2A:
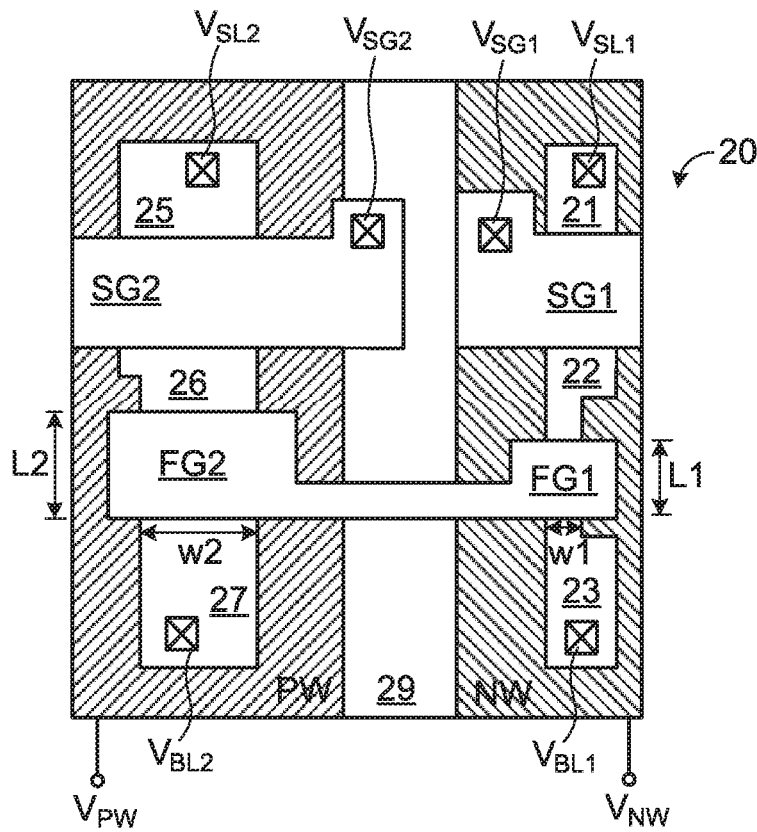
FIG. 2A is a schematic top view illustrating an erasable programmable non-volatile memory according to a first embodiment of the present invention.
Figure 2B:
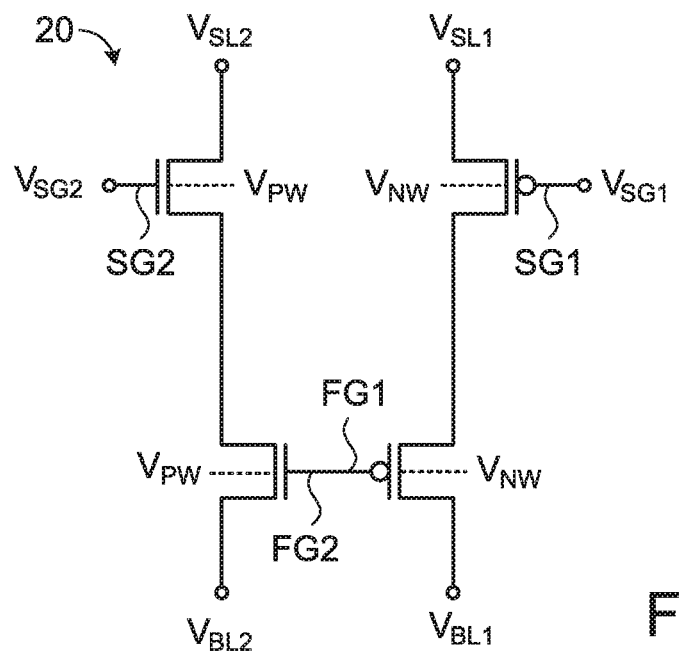
FIG. 2B is a schematic equivalent circuit diagram of the erasable programmable non-volatile memory of FIG. 2A.

FIG. 2A is a schematic top view illustrating an erasable programmable non-volatile memory according to a first embodiment of the present invention. FIG. 2B is a schematic equivalent circuit diagram of the erasable programmable non-volatile memory of FIG. 2A.

As shown in FIG. 2A, the erasable programmable non-volatile memory 20 comprises two serially-connected p-type transistors and two serially-connected n-type transistors. These two p-type transistors are constructed in an n-well region (NW). The two serially-connected n-type transistors are constructed in a p-well region (PW). The n-well region (NW) and the p-well region (PW) are separated from each other by a separation structure 29. For example, the separation structure 29 is a p-type substrate region, a n-type substrate region or a deep n-well (DNW) region.

Three p-type doped regions 21, 22 and 23 are formed in the n-well region (NW). In addition, a polysilicon gate SG1 is spanned over the area between the p-type doped regions 21 and 22, and a polysilicon gate FG1 is spanned over the area between the three p-type doped regions 22 and 23. The first p-type transistor is used as a first select transistor, and the polysilicon gate SG1 (also referred as a select gate) of the first p-type transistor is connected to a first select gate voltage $V_{SG1}$. The p-type doped region 21 is connected to a first source line voltage $V_{SL1}$. The p-type doped region 22 is a combination of a p-type doped drain region of the first p-type transistor and a p-type doped region of the second p-type transistor. The second p-type transistor is used as a first floating gate transistor. The polysilicon gate FG1 (also referred as a floating gate) is disposed over the second p-type transistor. The p-type doped region 23 is connected to a first bit line voltage $V_{BL1}$. Moreover, the n-well region (NW) is connected to an n-well voltage $V_{NW}$.

Three n-type doped regions 25, 26 and 27 are formed in the p-well region (PW). In addition, two polysilicon gates SG2 and FG2 are spanned over the areas between the three n-type doped regions 25, 26 and 27. The first n-type transistor is used as a second select transistor, and the polysilicon gate SG2 (also referred as a select gate) of the first n-type transistor is connected to a second select gate voltage $V_{SG2}$. The n-type doped region 25 is connected to a second source line voltage $V_{SL2}$. The n-type doped region 26 is a combination of an n-type doped drain region of the first n-type transistor and an n-type doped region of the second n-type transistor. The second n-type transistor is used as a second floating gate transistor. The polysilicon gate FG2 (also referred as a floating gate) is disposed over the second n-type transistor. The n-type doped region 27 is connected to a second bit line voltage $V_{BL2}$. Moreover, the p-well region (PW) is connected to a p-well voltage $V_{PW}$.

In this embodiment, the floating gate FG1 of the first floating gate transistor and the floating gate FG2 of the second floating gate transistor are formed of the same polysilicon gate. That is, the floating gate FG1 of the first floating gate transistor and the floating gate FG2 of the second floating gate transistor are connected with each other. Moreover, the channel length L1 of the first floating gate transistor is smaller than the channel length L2 of the second floating gate transistor, and the channel width w1 of the first floating gate transistor is smaller than the channel width w2 of the second floating gate transistor.

As shown in the equivalent circuit of FIG. 2B, the erasable programmable non-volatile memory 20 comprises a first select transistor, a second select transistor, a first floating gate transistor and a second floating gate transistor. That is, the four transistors constitute a memory cell of the erasable programmable non-volatile memory 20. The memory cell is connected with two bit lines, two source lines and two select lines.

The first select transistor and the first floating gate transistor are p-type transistors and constructed in the n-well region (NW). The n-well region (NW) receives the n-well voltage $V_{NW}$. The second select transistor and the second floating gate transistor are n-type transistors and constructed in the p-well region (PW). In addition, the p-well region (PW) receives the p-well voltage $V_{PW}$.

The select gate SG1 of the first select transistor receives the first select gate voltage $V_{SG1}$. The first source/drain terminal of the first select transistor receives the first source line voltage $V_{SL1}$. The first source/drain terminal of the first floating gate transistor is connected with the second source/drain terminal of the first select transistor. The second source/drain terminal of the first floating gate transistor receives the first bit line voltage $V_{BL1}$.

The select gate SG2 of the second select transistor receives the second select gate voltage $V_{SG2}$. The first source/drain terminal of the second select transistor receives the second source line voltage $V_{SL2}$. The first source/drain terminal of the second floating gate transistor is connected with the second source/drain terminal of the second select transistor. The second source/drain terminal of the second floating gate transistor receives the second bit line voltage $V_{BL2}$.

The operations of the erasable programmable non-volatile memory 20 will be described as follows.

During a program cycle of the non-volatile memory 20, the first select transistor and the first floating gate transistor are activated. Consequently, hot carriers (e.g. electrons) are transferred through a channel region of the first floating gate transistor and injected into the floating gate FG1.

During an erase cycle of the non-volatile memory 20, a voltage difference between the floating gate FG1 of the first floating gate transistor and the n-well region (NW) is higher enough, and the electrons are ejected from the floating gate FG1 of the first floating gate transistor to the n-well region (NW).

In a read cycle of the non-volatile memory 20, the second select transistor and the second floating gate transistor are activated. According to the amount of electrons in the floating gate FG2, the second floating gate transistor generates a read current. According to the magnitude of the read current, the storage state of the non-volatile memory 20 is determined.

FIGS. 3A~3D schematically illustrate the bias voltages and the operations of the erasable programmable non-volatile memory according to the first embodiment of the present invention in a negative operation mode. In the negative operation mode, the bias voltages received by the non-volatile memory 20 contain negative voltage values.

As shown in FIGS. 3A and 3B, the program cycle is divided into two time periods. For example, the program cycle needs 50 μs, the first time period (or an earlier stage) of the program cycle is 20 μs, and the second time period (or a later stage) of the program cycle is 30 μs.

In the earlier stage of the program cycle, the second select gate voltage $V_{SG2}$, the second source line voltage $V_{SL2}$, the second bit line voltage $V_{BL2}$ and the p-well voltage $V_{PW}$ are all 0V. Moreover, the first select gate voltage $V_{SG1}$ is 0V, the first source line voltage $V_{SL1}$ is 5V, the first bit line voltage $V_{BL1}$ is −2V, and the n-well voltage $V_{NW}$ is 5V. Under the above bias condition, the voltage coupled to the floating gate FG1 of the first floating gate is around 0V, then the first floating transistor is turned on. Moreover, the first select transistor is turned on, and a program current Ipgm flows through the first select transistor. Consequently, electrons are injected into the floating gate FG1 through the channel region of the first floating gate transistor.

In the later stage of the program cycle, the second select gate voltage $V_{SG2}$, the second source line voltage $V_{SL2}$, the second bit line voltage $V_{BL2}$ are all applied with a ramp voltage (i.e. all increase to 5V), and the p-well voltage $V_{PW}$ is 0V. Consequently, the floating gate FG2 of the second floating gate transistor is coupled to have the voltage of about 5V. Since the two floating gates FG1 and FG2 are connected with each other, the voltage coupled to the floating gate FG1 of the first floating gate transistor is about 5V. Under this circumstance, more electrons are injected into the floating gate FG1 of the first floating gate transistor. Consequently, the program efficiency of the non-volatile memory 20 is enhanced. In another embodiment, a voltage application mode of the ramp voltage (applied to the second select gate voltage VSG2, the second source line voltage VSL2, the second bit line voltage VBL2) is, for example, a single-stage incremental application mode, a multi-stage incremental application mode, or a smooth incremental application mode.

Please refer to FIGS. 3A and 3C. During the erase cycle, the second select gate voltage $V_{SG2}$, the second source line voltage $V_{SL2}$, the second bit line voltage $V_{BL2}$ and the p-well voltage $V_{PW}$ are all −7.5V. In addition, the first select gate voltage $V_{SG1}$, the first source line voltage $V_{SL1}$, the first bit line voltage $V_{BL1}$ and the n-well voltage $V_{NW}$ are all 7.5V.

Since the floating gate FG2 of the second floating gate transistor is coupled to have the voltage of about −7.5V and both of the first bit line voltage $V_{BL1}$ and the n-well voltage $V_{NW}$ are 7.5V, a voltage difference between the floating gate FG1 of the first floating gate transistor and the n-well voltage $V_{NW}$ is about 15V. Consequently, the electrons are ejected from the floating gate FG1 of the first floating gate transistor to the n-well region (NW).

Please refer to FIGS. 3A and 3D. During the read cycle, the first select gate voltage $V_{SG1}$, the first source line voltage $V_{SL1}$, the first bit line voltage $V_{BL1}$ and the n-well voltage $V_{NW}$ are all 2.5V. Consequently, the first select transistor is turned off. In addition, the second select gate voltage $V_{SG2}$ is 2.5V, the second source line voltage $V_{SL2}$ is 0V, the second bit line voltage $V_{BL2}$ is 2.5V, and the p-well voltage $V_{PW}$ is 0V. Consequently, the second select transistor is turned on, and the second floating gate transistor generates a read current Iread.

Generally, the magnitude of the read current Iread is determined according to the amount of electrons stored in the floating gate FG2 of the second floating gate transistor. For example, in case that electrons are stored in the floating gate FG2 of the second floating gate transistor, the second floating gate transistor is turned off and the magnitude of the generated read current Iread is very low (e.g., nearly zero). Whereas, in case that no electrons are stored in the floating gate FG2 of the second floating gate transistor, the second floating gate transistor is turned on and the magnitude of the generated read current Iread is higher. Consequently, the storage state of the non-volatile memory 20 is determined according to the magnitude of the read current Iread.

As mentioned above, the channel length L1 of the first floating gate transistor is smaller than the channel length L2 of the second floating gate transistor, and the channel width w1 of the first floating gate transistor is smaller than the channel width w2 of the second floating gate transistor. Consequently, the program efficiency of the first floating gate transistor is enhanced, and the read efficiency of the second floating gate transistor is enhanced.

Figures 4, 5:
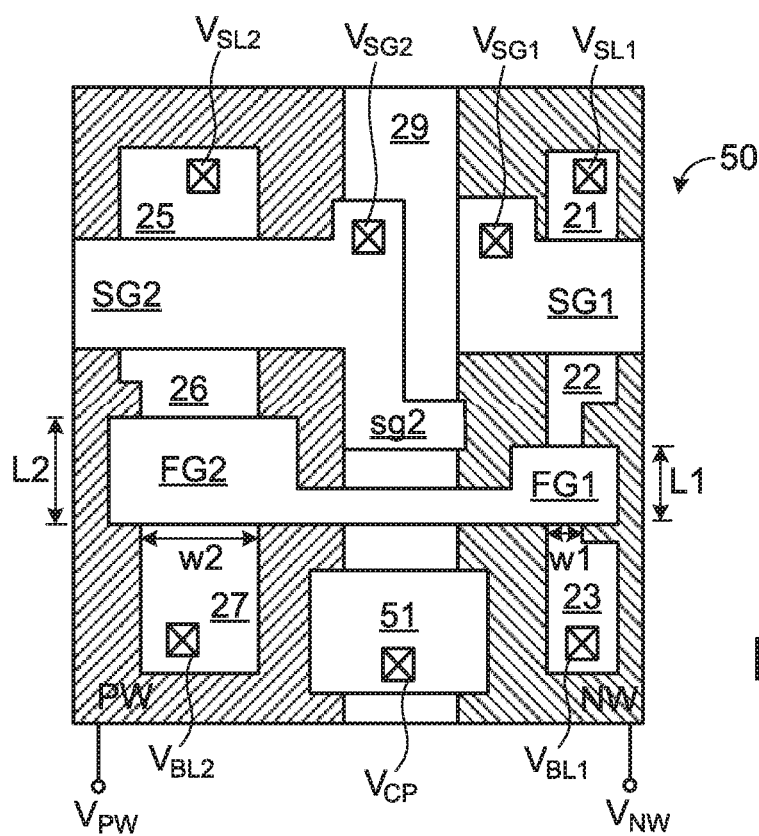
FIG. 4 schematically illustrates the bias voltages of the erasable programmable non-volatile memory according to the first embodiment of the present invention in a positive operation mode.
FIG. 5 is a schematic top view illustrating an erasable programmable non-volatile memory according to a second embodiment of the present invention.

Similarly, the erasable programmable non-volatile memory 20 may be operated in a positive operation mode. FIG. 4 schematically illustrates the bias voltages of the erasable programmable non-volatile memory according to the first embodiment of the present invention in a positive operation mode. During the program cycle, the erase cycle and the read cycle, all of the bias voltages received by the non-volatile memory 20 are larger than or equal to 0. The program action, the erase action and the read action of the non-volatile memory 20 in the positive operation mode are similar to those as shown in FIGS. 3B, 3C and 3D, and are not redundantly described herein.

For increasing the program efficiency, the erase efficiency and the read efficiency, the structure of the non-volatile memory needs to be modified. FIG. 5 is a schematic top view illustrating an erasable programmable non-volatile memory according to a second embodiment of the present invention.

In comparison with the first embodiment, the non-volatile memory 50 of this embodiment further comprises a coupling layer 51 and an extension part (sg2). The extension part (sg2) is a portion of the select gate SG2. The coupling layer 51 receives a coupling voltage $V_{CP}$. For example, the coupling voltage $V_{CP}$ is equal to the second select gate voltage $V_{SG2}$.

In this embodiment, the coupling layer 51 is located near the floating gates FG1 and FG2. The same, the extension part (sg2) of the select gate SG2 is extended to near the floating gates FG1 and FG2. Moreover, the coupling layer 51 not contacted with the four transistors of the non-volatile memory 50. The coupling layer 51 is a polysilicon layer or a metal layer. In case that the coupling layer 51 is the polysilicon layer, the coupling layer 51 is arranged beside the floating gates FG1 and FG2. In case that the coupling layer 51 is the metal layer, the coupling layer 51 is disposed over the floating gates FG1 and FG2. During the program cycle, the erase cycle or the read cycle, the coupling voltage $V_{CP}$ of the coupling layer 51 is coupled to the floating gates FG1 and FG2. Consequently, the program efficiency, the erase efficiency and the read efficiency are enhanced.

Figure 6A:
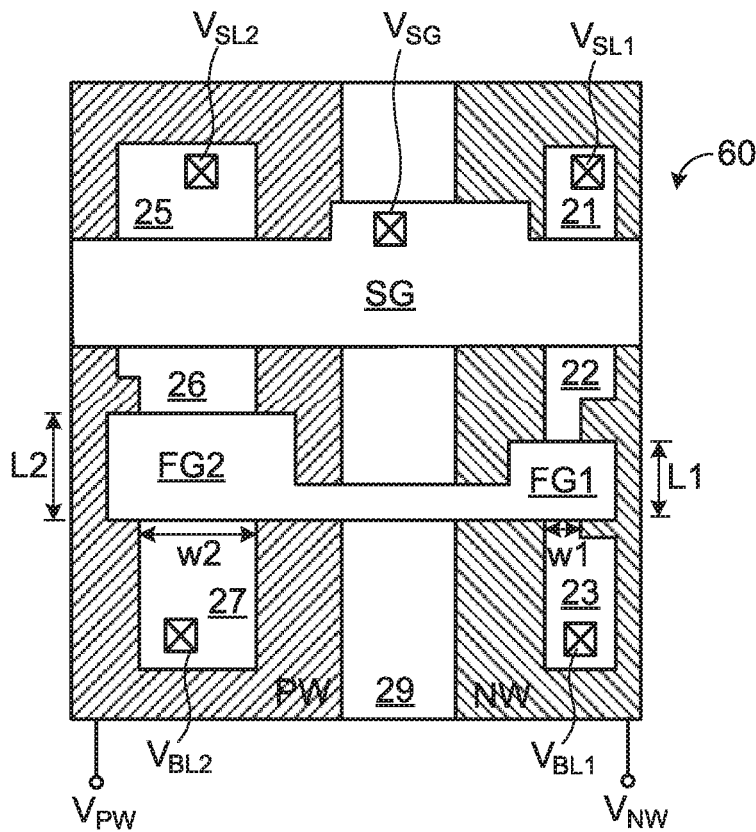
FIG. 6A is a schematic top view illustrating an erasable programmable non-volatile memory according to a third embodiment of the present invention.
Figure 6B:
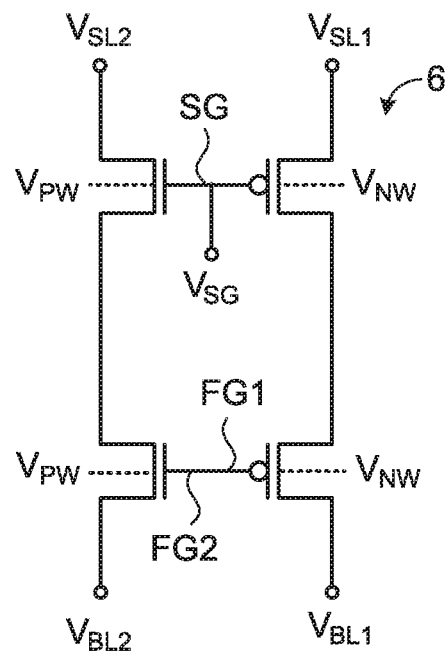
FIG. 6B is a schematic equivalent circuit diagram of the erasable programmable non-volatile memory of FIG. 6A.

FIG. 6A is a schematic top view illustrating an erasable programmable non-volatile memory according to a third embodiment of the present invention. FIG. 6B is a schematic equivalent circuit diagram of the erasable programmable non-volatile memory of FIG. 6A.

In comparison with the first embodiment, the first select transistor and the second select transistor of the non-volatile memory 60 have a common select gate SG. That is, the select gate of the first select transistor and the select gate of the second select transistor are connected with each other to receive the select gate voltage $V_{SG}$.

By changing the connecting relationship between associated structures of the non-volatile memory 20 of the first embodiment, the non-volatile memory 60 of the third embodiment can be produced. For example, the select gates SG1 and SG2 of the first select transistor and the second select transistor of the non-volatile memory in the first embodiment are connected with each other. In addition, the first select gate voltage $V_{SG1}$ and the second select gate voltage $V_{SG2}$ are equal.

FIGS. 7A~7D schematically illustrate the bias voltages and the operations of the erasable programmable non-volatile memory according to the third embodiment of the present invention in a negative operation mode.

Please refer to FIGS. 7A and 7B. In the earlier stage of the program cycle, the select gate voltage $V_{SG}$, the second source line voltage $V_{SL2}$, the second bit line voltage $V_{BL2}$ and the p-well voltage $V_{PW}$ are all 0V. Moreover, the first source line voltage $V_{SL1}$ is 5V, the first bit line voltage $V_{BL1}$ is −2V, and the n-well voltage $V_{NW}$ is 5V. Under the above bias condition, the voltage coupled to the floating gate FG1 of the first floating gate is around 0V, the first floating gate transistor is turned on. Moreover, the first select transistor is turned on, and a program current Ipgm flows through the first select transistor. Consequently, electrons are injected into the floating gate FG1 through the channel region of the first floating gate transistor.

In the later stage of the program cycle, both of the second source line voltage $V_{SL2}$ and the second bit line voltage $V_{BL2}$ are all applied with a ramp voltage. (i.e. all increased to 5V). Consequently, the floating gate FG2 of the second floating gate transistor is coupled to have the voltage of about 5V. Since the two floating gates FG1 and FG2 are connected with each other, the voltage coupled to the floating gate FG1 of the first floating gate transistor is about 5V. Under this circumstance, more electrons are injected into the floating gate FG1 of the first floating gate transistor. Consequently, the program efficiency of the non-volatile memory 60 is enhanced.

In another embodiment, a voltage application mode of the ramp voltage (applied to the second source line voltage $V_{SL2}$, the second bit line voltage $V_{BL2}$) is, for example, a single-stage incremental application mode, a multi-stage incremental application mode, or a smooth incremental application mode.

Please refer to FIGS. 7A and 7C. During the erase cycle, the second source line voltage $V_{SL2}$, the second bit line voltage $V_{BL2}$ and the p-well voltage $V_{PW}$ are all −7.5V. In addition, the select gate voltage $V_{SG}$, the first source line voltage $V_{SL1}$, the first bit line voltage $V_{BL1}$ and the n-well voltage $V_{NW}$ are all 7.5V. Consequently, the first select transistor and the second select transistor are turned off.

Since the floating gate FG2 of the second floating gate transistor is coupled to have the voltage of about −7.5V and both of the first bit line voltage $V_{BL1}$ and the n-well voltage $V_{NW}$ are 7.5V, a voltage difference between the floating gate FG1 of the first floating gate transistor and the n-well voltage $V_{NW}$ is about 15V. Consequently, the electrons are ejected from the floating gate FG1 of the first floating gate transistor to the n-well region (NW).

Please refer to FIGS. 7A and 7D. During the read cycle, the select gate voltage $V_{SG}$, the first source line voltage $V_{SL1}$, the first bit line voltage $V_{BL1}$ and the n-well voltage $V_{NW}$ are all 2.5V. Consequently, the first select transistor is turned off. In addition, the second source line voltage $V_{SL2}$ is 0V, the second bit line voltage $V_{BL2}$ is 2.5V, and the p-well voltage $V_{PW}$ is 0V. Consequently, the second select transistor is turned on, and the second floating gate transistor generates a read current Iread.

Similarly, the magnitude of the read current Iread is determined according to the amount of electrons stored in the floating gate FG2 of the second floating gate transistor. Consequently, the storage state of the non-volatile memory 60 is determined according to the magnitude of the read current Iread.

Similarly, the erasable programmable non-volatile memory 60 may be operated in a positive operation mode. FIG. 8 schematically illustrates the bias voltages of the erasable programmable non-volatile memory according to the third embodiment of the present invention in a positive operation mode. The program action, the erase action and the read action of the non-volatile memory 60 in the positive operation mode are similar to those as shown in FIGS. 7B, 7C and 7D, and are not redundantly described herein.

It is noted that numerous modifications and alterations may be made while retaining the teachings of the invention. For example, the erasable programmable non-volatile memory of the third embodiment is further equipped with a coupling layer for receiving a coupling voltage. Consequently, the program efficiency, the erase efficiency and the read efficiency are enhanced.

FIG. 9A is a schematic top view illustrating an erasable programmable non-volatile memory according to a fourth embodiment of the present invention. FIG. 9B is a schematic equivalent circuit diagram of the erasable programmable non-volatile memory of FIG. 9A.

In comparison with the first embodiment, the erasable programmable non-volatile memory 90 of this embodiment further comprises an n-type heavily doped region (N+). The n-type heavily doped region (N+) is formed in the n-well region (NW). In such way, a capacitor is formed between the floating gate FG1, the floating gate FG2 and the n-type heavily doped region (N+). The arrangement of the capacitor can form an alternative ejection path of electrons during the erase operation, thus the electron path of the respective program, erase and read action are separated. In this way, the reliability of the non-volatile memory 90 is enhanced.

Since the n-type heavily doped region (N+) is connected with the n-well region (NW), the n-type heavily doped region (N+) also receives the n-well voltage $V_{NW}$. As shown in FIG. 9B, a first terminal of the capacitor is connected with the floating gates FG1 and FG2, and a second terminal of the capacitor receives the n-well voltage $V_{NW}$.

FIGS. 10A~10D schematically illustrate the bias voltages and the operations of the erasable programmable non-volatile memory according to the fourth embodiment of the present invention in a positive operation mode.

Please refer to FIGS. 10A and 10B. In the earlier stage of the program cycle, the second source line voltage $V_{SL2}$ and the second bit line voltage $V_{BL2}$ are all 3V. Moreover, the first select gate voltage $V_{SG1}$ is 3.5V, the first source line voltage $V_{SL1}$ is 7V, the first bit line voltage $V_{BL1}$ is 0V, the n-well voltage $V_{NW}$ is 7V, and the p-well voltage $V_{PW}$ is 0V. In this condition, the first select transistor is turned on, and a program current Ipgm flows through the first select transistor. Consequently, electrons are injected into the floating gate FG1 through the channel region of the first floating gate transistor.

In the later stage of the program cycle, the second select gate voltage $V_{SG2}$, the second source line voltage $V_{SL2}$ and the second bit line voltage $V_{BL2}$ are all applied with a ramp voltage (i.e. all increased to 6V). Consequently, the floating gate FG2 of the second floating gate transistor is coupled to have the voltage of about 6V. Since the two floating gates FG1 and FG2 are connected with each other, the voltage coupled to the floating gate FG1 of the first floating gate transistor is about 6V. Under this circumstance, more electrons are injected into the floating gate FG1 of the first floating gate transistor. Consequently, the program efficiency of the non-volatile memory 90 is enhanced.

In another embodiment, a voltage application mode of the ramp voltage (applied to the second select gate voltage $V_{SG2}$, the second source line voltage $V_{SL2}$, the second bit line voltage $V_{BL2}$) is, for example, a single-stage incremental application mode, a multi-stage incremental application mode, or a smooth incremental application mode.

Please refer to FIGS. 10A and 10C. During the erase cycle, the second select gate voltage $V_{SG2}$, the second source line voltage $V_{SL2}$, the second bit line voltage $V_{BL2}$ and the p-well voltage $V_{PW}$ are all 0V. In addition, the first select gate voltage $V_{SG1}$, the first source line voltage $V_{SL1}$ and the first bit line voltage $V_{BL1}$ are all 7.5V, and the n-well voltage $V_{NW}$ is 15V.

Since the floating gate FG2 of the second floating gate transistor is coupled to have the voltage of about 0V and the n-type heavily doped region (N+) also receives the n-well voltage $V_{NW}$ of 15V, a voltage difference between the floating gate FG1 of the first floating gate transistor and the n-type heavily doped region (N+) is 15V. Consequently, the electrons are ejected from the floating gate FG1 of the first floating gate transistor to the n-well region (NW) through the capacitor and the n-type heavily doped region (N+).

Please refer to FIGS. 10A and 10D. During the read cycle, the first select gate voltage $V_{SG1}$, the first source line voltage $V_{SL1}$, the first bit line voltage $V_{BL1}$ and the n-well voltage $V_{NW}$ are all 2.5V. In addition, the second select gate voltage $V_{SG2}$ is 2.5V, the second source line voltage $V_{SL2}$ is 0V, the second bit line voltage $V_{BL2}$ is 2.5V, and the p-well voltage $V_{PW}$ is 0V. Consequently, the second select transistor is turned on, and the second floating gate transistor generates a read current Iread.

Generally, the magnitude of the read current Iread is determined according to the amount of electrons stored in the floating gate FG2 of the second floating gate transistor. Consequently, the storage state of the non-volatile memory 90 is determined according to the magnitude of the read current Iread.

It is noted that numerous modifications and alterations may be made while retaining the teachings of the invention. For example, the erasable programmable non-volatile memory of the fourth embodiment is further equipped with a coupling layer for receiving a coupling voltage. Consequently, the program efficiency, the erase efficiency and the read efficiency are enhanced.

In the above embodiments, the p-type select transistor and the p-type floating gate transistor are responsible for the program action and the erase action, and the n-type select transistor and the n-type floating gate transistor are responsible for the read action. It is noted that numerous modifications and alterations may be made while retaining the teachings of the invention. For example, in another embodiment, the n-type select transistor and the n-type floating gate transistor are responsible for the program action and the erase action, and the p-type select transistor and the p-type floating gate transistor are responsible for the read action.

From the above descriptions, the present invention provides an erasable programmable non-volatile memory. The erasable programmable non-volatile memory can be operated in a positive operation mode or a negative operation mode to perform the program action and the erase action. In addition, the read action is performed to determine the storage state of the non-volatile memory.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An erasable programmable non-volatile memory, comprising:
    a first select transistor comprising a select gate, a first source/drain terminal and a second source/drain terminal;
    a first floating gate transistor comprising a floating gate, a first source/drain terminal and a second source/drain terminal, wherein the first source/drain terminal of the first floating gate transistor is connected with the second source/drain terminal of the first select transistor;
    a second select transistor comprising a select gate, a first source/drain terminal and a second source/drain terminal; and
    a second floating gate transistor comprising a floating gate, a first source/drain terminal and a second source/drain terminal, wherein the first source/drain terminal of the second floating gate transistor is connected with the second source/drain terminal of the second select transistor,
    wherein the first select transistor and the first floating gate transistor are constructed in a first-type well region, the second select transistor and the second floating gate transistor are constructed in a second-type well region, and the floating gate of the first floating gate transistor and the floating gate of the second floating gate transistor are connected with each other;
    wherein the first floating gate transistor has a first channel length, and the second floating gate transistor has a second channel length, and the first channel length is smaller than the second channel length.

2. The erasable programmable non-volatile memory as claimed in claim 1, wherein the first select transistor and the first floating gate transistor are n-type transistors, and the first-type well region is a p-type well region, wherein the second select transistor and the second floating gate transistor are p-type transistors, and the second-type well region is an n-type well.

3. The erasable programmable non-volatile memory as claimed in claim 1, wherein the first select transistor and the first floating gate transistor are p-type transistors, and the first-type well region is an n-type well region, wherein the second select transistor and the second floating gate transistor are n-type transistors, and the second-type well region.

4. The erasable programmable non-volatile memory as claimed in claim 1, wherein the first floating gate transistor has a first channel width, and the second floating gate transistor has a second channel width, wherein the first channel width is smaller than the second channel width.

5. The erasable programmable non-volatile memory as claimed in claim 1, wherein the select gate of the first select transistor and the select gate of the second select transistor are connected with each other.

6. The erasable programmable non-volatile memory as claimed in claim 1, further comprising a capacitor, wherein a first terminal of the capacitor is connected with the floating gate of the first floating gate transistor, and a second terminal of the capacitor is connected with the first-type well region.

7. An erasable programmable non-volatile memory, comprising:
    a first-type well region;
    a first doped region, a second doped region and a third doped region, which are formed in a surface of the first-type well region;
    a first select gate spanned over an area between the first doped region and the second doped region;
    a first floating gate spanned over an area between the second doped region and the third doped region;
    a second-type well region;
    a fourth doped region, a fifth doped region and a sixth doped region, which are formed in a surface of the second-type well region;
    a second select gate spanned over an area between the fourth doped region and the fifth doped region;
    a second floating gate spanned over an area between the fifth doped region and the sixth doped region, wherein the second floating gate is contacted with the first floating gate; and
    a seventh doped region formed in the first-type well region and located beside the first floating gate;
    wherein the first-type well region, the second doped region, the third doped region and the first floating gate are collaboratively formed as a first floating gate transistor, and the second-type well region, the fifth doped region, the sixth doped region and the second floating gate are collaboratively formed as a second floating gate transistor.

8. The erasable programmable non-volatile memory as claimed in claim 7, wherein the first-type well region is a p-type well region, and the second-type well region is an n-type well,
    wherein the first doped region, the second doped region and the third doped region are n-type doped regions, and the fourth doped region, the fifth doped region and the sixth doped region are p-type doped regions.

9. The erasable programmable non-volatile memory as claimed in claim 7, wherein the first-type well region is an n-type well region, and the second-type well region is a p-type well,
    wherein the first doped region, the second doped region and the third doped region are p-type doped regions, and the fourth doped region, the fifth doped region and the sixth doped region are n-type doped regions.

10. The erasable programmable non-volatile memory as claimed in claim 7, wherein the first floating gate transistor has a first channel length, and the second floating gate transistor has a second channel length, wherein the first channel length is smaller than the second channel length.

11. The erasable programmable non-volatile memory as claimed in claim 7, wherein the first floating gate transistor has a first channel width, and the second floating gate transistor has a second channel width, wherein the first channel width is smaller than the second channel width.

12. The erasable programmable non-volatile memory as claimed in claim 7, wherein the first select gate and the second select gate are connected with each other.

13. The erasable programmable non-volatile memory as claimed in claim 7, wherein the seventh doped region is a heavily doped region.

14. The erasable programmable non-volatile memory as claimed in claim 7, wherein the second select gate includes an extension part extended to near the first floating gate and the second floating gate.

15. The erasable programmable non-volatile memory as claimed in claim 7, further comprising a coupling layer, wherein the coupling layer is located near the first floating gate and the second floating gate.

16. The erasable programmable non-volatile memory as claimed in claim 15, wherein the coupling layer is a polysilicon layer, and the coupling layer is arranged beside the first floating gate and the second floating gate.

17. The erasable programmable non-volatile memory as claimed in claim 15, wherein the coupling layer is a metal layer, and the coupling layer is disposed over the first floating gate and the second floating gate.

* * * * *